(12) United States Patent
Choi et al.

(10) Patent No.: US 9,353,459 B2
(45) Date of Patent: May 31, 2016

(54) METHOD AND APPARATUS CAPABLE OF SYNTHESIZING HIGH-DENSITY WIRES IN PORES AND ON SURFACE OF POROUS MATERIAL

(71) Applicant: Industry-Academic Cooperation Foundation, Yonsei University, Seoul (KR)

(72) Inventors: Doo Jin Choi, Seoul (KR); YooYoul Choi, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 2 days.

(21) Appl. No.: 14/077,482

(22) Filed: Nov. 12, 2013

(65) Prior Publication Data

US 2014/0154417 A1 Jun. 5, 2014

(30) Foreign Application Priority Data

Dec. 4, 2012 (KR) .......................... 10-2012-139476

(51) Int. Cl.
| | |
|---|---|
| *C23C 16/00* | (2006.01) |
| *C30B 25/00* | (2006.01) |
| *C30B 29/18* | (2006.01) |
| *C30B 29/60* | (2006.01) |
| *C23C 16/04* | (2006.01) |

(52) U.S. Cl.
CPC ............. *C30B 25/005* (2013.01); *C23C 16/045* (2013.01); *C30B 29/18* (2013.01); *C30B 29/60* (2013.01)

(58) Field of Classification Search
CPC ...... C23C 16/44; C03B 25/005; C03B 29/60; C03B 29/18
See application file for complete search history.

(56) References Cited

U.S. PATENT DOCUMENTS

| | | | |
|---|---|---|---|
| 2004/0067602 A1* | 4/2004 | Jin .................................. | 438/22 |
| 2005/0170089 A1* | 8/2005 | Lashmore et al. .......... | 427/248.1 |
| 2006/0233692 A1* | 10/2006 | Scaringe et al. ............. | 423/335 |
| 2008/0206463 A1* | 8/2008 | Grigorian et al. .......... | 427/249.1 |

FOREIGN PATENT DOCUMENTS

KR 10-2007-0013451 1/2007

* cited by examiner

*Primary Examiner* — Kelly M Gambetta
(74) *Attorney, Agent, or Firm* — Lex IP Meister, PLLC

(57) ABSTRACT

According to an embodiment of the present invention, provided is a method of synthesizing nanowires that includes the following steps of: disposing a covering inside a reaction furnace such that the covering is spaced apart by a predetermined gap from a substrate which is provided for synthesis of nanowires; heating the reaction furnace; and synthesizing nanowires by allowing a source gas to be deposited on the substrate while flowing through the gap between the substrate and the covering.

5 Claims, 5 Drawing Sheets

METHOD AND APPARATUS CAPABLE OF SYNTHESIZING HIGH-DENSITY WIRES IN PORES AND ON SURFACE OF POROUS MATERIAL

CROSS REFERENCE TO RELATED APPLICATION

The present application claims priority from Korean Patent Application Number 10-2012-0139476 filed on Dec. 4, 2012, the entire contents of which are incorporated herein for all purposes by this reference.

BACKGROUND OF THE INVENTION

1. Field of the Invention

The present invention relates to formation of nanowires, and more particularly, to a method and apparatus capable of synthesizing high-density wires in the inner pores and on surfaces of a variety of porous materials.

2. Description of Related Art

Recently, many studies are being performed on the synthesis of one-dimensional nano-structures. Among the nano-structures, nanowires exhibit new optical, electrical and mechanical properties compared to existing bulk-size materials. Therefore, active studies on nano technology are being carried out in many countries.

Nanowires are attracting strong interest, since they have unique optical and electrical characteristics compared to physical properties of bulk materials. Since silica nanowires emit strong blue light, it is possible to develop a nanoscale optical device using this property. In addition, when silica nanowires are used for a waveguide that is a transmission line for a high-frequency bandwidth, the loss ratio is low and the use of high power is possible. In addition, application of silica nanowires to a scanning near-field optical microscope (SNOM) that requires a tip of a microscopic hole can lead to high definition by overcoming the limited diffraction of quantum.

In order for such materials to be applied, the properties of nanowires, or a nano-material having a one-dimensional structure, must be precisely controlled in optical and electrical methods, and a variety of studies on the method of synthesizing nanowires are being carried out.

According to a related-art method of synthesizing silica nanowires, $SiH_4$ is used as a source gas. However, the high price of the $SiH_4$ gas is burdensome due to a shortage since this gas is used as an essential raw material in the photovoltaic industry and for the fabrication of semiconductor wafers. In addition, the $SiH_4$ gas is harmful, which leads to the problem in that a separate safety device must be added for the supply of the $SiH_4$ gas. Due to these problems, the need for a material that can be a substitute for $SiH_4$ is increasing.

Another related-art method of fabricating silica nanowires involves loading silicon powder into a chamber and evaporating the silicon powder through heat. In this case, however, the process must involve raising the temperature until the silicon powder has evaporated, and concentric evaporation is not realized at a specific point in time. Therefore, it is difficult to control the process. In addition, this method uses catalyst in most cases, and the catalyst can be contained in silica nanowires as impurities. This also requires an additional process of removing the catalyst, which is problematic.

In addition, porous ceramic filters or the like are used for filtering exhaust gas from vehicles. These filters include nanowires, such as whiskers, grown inside the pores. In addition, when nanowires are formed inside the pores of porous structural materials, the effect of increased strength can also be obtained.

A related-art method of growing such wires includes placing a porous substrate inside a reaction chamber and blowing a source gas into the reaction chamber, thereby growing wires on the porous substrate under specific conditions (e.g. refer to Korean Patent No. 10-753114). However, process conditions where wires are actually grown are complicated. When such conditions are not satisfied, wires are grown into the shape of a pressed film when observed with a microscope and fail to obtain expected advantages, which is problematic. In addition, there is another limitation in which the structural shape of wires grown on the surface of the substrate or the surface of the pores is not controlled.

The information disclosed in the Background of the Invention section is provided only for better understanding of the background of the invention, and should not be taken as an acknowledgment or any form of suggestion that this information forms a prior art that would already be known to a person skilled in the art

BRIEF SUMMARY OF THE INVENTION

Various aspects of the present invention provide a method and apparatus capable of synthesizing high-density wires not only on the surface of a porous material but also in the pores of the porous material.

Also provided is a method and apparatus capable of synthesizing nanowires in the shape of wires instead of a film not only on the surface of a porous material but also in the pores of the porous material.

Also provided is a method and apparatus capable of synthesizing wires while controlling the structural shape of wires that are formed on the surface and in the pores of a porous material.

In an aspect of the present invention, provided is a method of synthesizing nanowires that includes the following steps of: disposing a covering inside a reaction furnace such that the covering is spaced apart by a predetermined gap from a substrate which is provided for synthesis of nanowires; heating the reaction furnace; and synthesizing nanowires by allowing a source gas to be deposited on the substrate while flowing through the gap between the substrate and the covering.

According to an embodiment of the present invention, the covering may be spaced apart by the predetermined gap from a surface of the substrate on which nanowires are to be formed.

The substrate may be a porous substrate.

The nanowires may be formed not only on the surface of the porous substrate but also in pores inside the porous substrate.

A shape of nanowires that are formed may differ depending on a size of the gap between the substrate and the covering.

The nanowires formed on the substrate may have a clearer shape as the size of the gap decreases.

The gap between the substrate and the covering may be preset depending on design criteria.

The covering may be connected to a displacing means for displacing the covering, and the gap between the substrate and the covering may be changed by controlling the displacement of the displacing means using a control unit.

In another aspect of the present invention, provided is an apparatus for synthesizing nanowires on a substrate. The apparatus includes: a deposition chamber which performs a deposition process of depositing a predetermined material on a substrate placed on a mounting part; and a gas feed system which feeds a reactant gas to the deposition chamber. The gas feed system includes a reactant source connected to the deposition chamber, the reactant source supplying a reactant required for deposition inside the deposition chamber, and a carrier gas source connected to the deposition chamber and the reactant source, the carrier gas source supplying a carrier gas that carries the reactant into the deposition chamber. The deposition chamber may include a reaction furnace which can stay in vacuum and at high temperature. One end of the reaction furnace is connected to the carrier gas source and the reactant source, and the other end of the reaction furnace is connected to a vacuum pump. The deposition chamber may further include a heating element disposed around the reaction furnace. The heating element is configured to heat the reaction furnace. A substrate on which nanowires are to be synthesized and a covering are disposed inside the reaction furnace. The covering is spaced apart by a predetermined gap from the substrate. Inside the reaction chamber, a gas of the reactant source is deposited on the substrate while flowing through the gap between the substrate and the covering, thereby synthesizing nanowires.

According to an embodiment of the present invention, the covering may be spaced apart by the predetermined gap from a surface of the substrate on which nanowires are to be formed.

The substrate may be a porous substrate.

The nanowires may be formed not only on the surface of the porous substrate but also in pores inside the porous substrate.

The shape of nanowires that are formed may differ depending on a size of the gap between the substrate and the covering.

The nanowires formed on the substrate may have a clearer shape as the size of the gap decreases.

The gap between the substrate and the covering may be preset depending on design criteria.

The apparatus may further include a displacing means which is connected to the covering and displaces the covering and a control unit which controls displacement of the displacing means. The gap between the substrate and the covering can be changed by controlling the displacement of the displacing means using the control unit.

According to the present invention, the covering is disposed inside the nanowire-synthesizing tube by a predetermined gap from the substrate. The flow of the reactant source gas is retarded while passing through the gap. This consequently forms a vortex flow, whereby nanowires are formed on the surface and in the pores of the substrate. Accordingly, the application of a simple structure of the covering makes it possible to form high-density nanowires on the surface of the porous substrate and in the pores inside the porous substrate.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Reference will now be made in detail to various embodiments of the present invention, examples of which are illustrated in the accompanying drawings and described below. In the following description of the present invention, detailed descriptions of the components that are well-known in the art as for the synthesis of nanowires will be omitted. In particular, detailed descriptions of the components for feeding a source gas, a carrier gas or the like into a chamber will be omitted, since those components are well-known in the art. Although such descriptions are omitted, the features of the present invention will be apparent to a person having ordinary skill in the art upon reading the following description.

Figure 1:
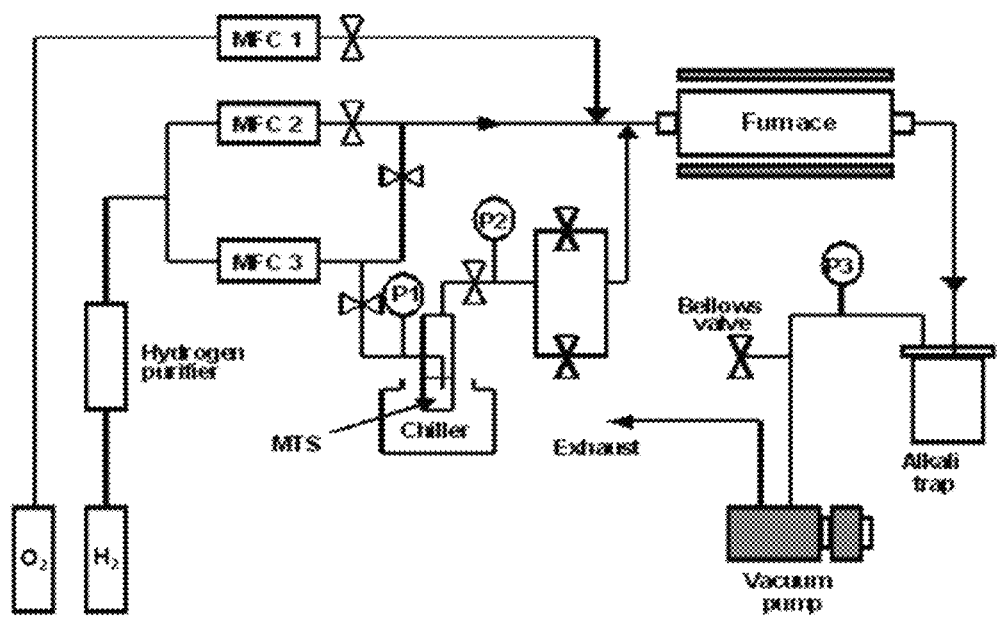
FIG. 1 is a block diagram schematically showing a configuration of an apparatus for synthesizing nanowires according to an embodiment of the present invention.

FIG. 1 is a block diagram schematically showing the configuration of an apparatus for synthesizing nanowires according to an embodiment of the present invention.

The apparatus for synthesizing nanowires according to this embodiment generally includes a furnace and a gas feed system. The furnace performs a process of synthesizing a certain material, for example, nanowires, on a porous substrate mounted on a susceptor (not shown). The gas feed system feeds a reactant gas into the furnace.

The furnace is a hot wall-type horizontal deposition chamber that can be used at high temperature, and can be made of alumina.

The gas feed system includes a reactant source. The reactant source is connected to the furnace. According to an embodiment of the present invention, an organic silicon compound called methyltrichlorosilane (MTS), or $CH_3SiCl_3$, in which the content ratio of Si to C is 1:1, is used as a reactant. According to an embodiment of the present invention, the reactant source is evaporated before being fed into the furnace, and the gas of the reactant source is fed into the furnace. A vacuum gauge P1 is disposed between the reactant source and the furnace. The vacuum gauge P1 indicates a pressure of the reactant gas that is being fed. A user can adjust the pressure of the reactant source to be fed to an intended value (e.g. 10 torrs) by reading the pressure indicated on the vacuum gauge P1.

In addition, the gas feed system includes a carrier gas source. The carrier gas source is connected to the furnace, and feeds a carrier gas for carrying the MTS into the furnace. According to an embodiment of the present invention, the carrier gas is implemented as hydrogen ($H_2$) or argon (Ar) gas, and the flow rate of the carrier gas is controlled using a mass flow controller MFC3. The carrier gas supplied from the carrier gas source is fed into the reactant source under the control of the mass flow controller MFC3. The reactant source evaporates a liquid reactant into a gaseous reactant with which the hydrogen gas is mixed through bubbling. The mixture, i.e. the carrier gas and the reactant source gas, is fed into the furnace. Here, the bubbler, or chiller, is maintained at a constant temperature of 0° C.

Since the mixture of the reactant gas and the carrier gas is required to maintain a suitable concentration, the gas feed system includes a dilution gas source. The dilute gas source is also connected to the furnace, and the flow rate of a dilute gas is controlled using a mass flow controller MFC2. According to an embodiment of the present invention, the dilute gas is implemented as hydrogen or nitrogen.

In some embodiments, the gas feed system can include an oxygen gas source (additional gas source) connected to the furnace, and the flow rate of an oxygen gas is controlled using a mass flow controller MFC1. According to one embodiment, a silicon intermediate compound is produced from the oxygen gas source inside the furnace. In addition, the apparatus according to the present invention can further include an exhaust system. A byproduct, for example, HCl, is produced due to the reaction inside the furnace, and an alkali trap is provided in order to neutralize the byproduct. NaOH provided inside the alkali trap reacts with HCl, which is a byproduct from the furnace, thereby neutralizing HCl. A vacuum pump is also provided in order to absorb and discharge several gases that are produced during this neutralization. A bellows valve is provided in order to adjust the pressure of the vacuum pump. A vacuum gauge P3 provided between the bellows valve and the alkali trap displays the pressure inside the furnace. A user can read the pressure displayed on the vacuum gauge P3, and adjust the pressure inside the furnace to an intended deposition pressure (e.g. 50 torrs) during a deposition reaction inside the furnace.

Figure 2:
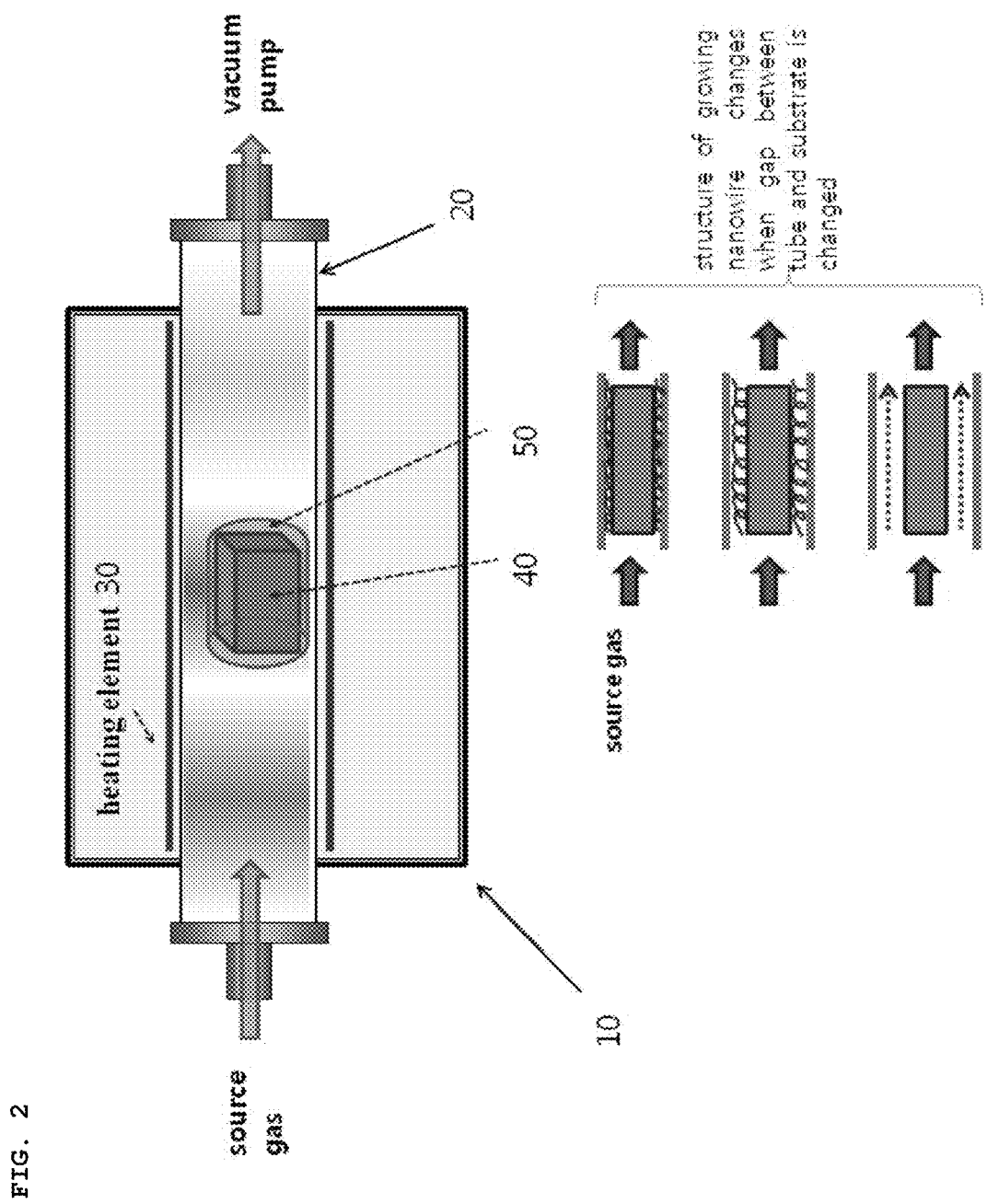
FIG. 2 is a view showing a structure of a deposition chamber (furnace) according to an embodiment of the present invention.

FIG. 2 shows the structure of a furnace 10 which synthesizes wires on the surface of a porous substrate and in the pores inside the porous substrate according to an embodiment of the present invention.

As shown in FIG. 2, a nanowire-synthesizing tube 20 is disposed inside the furnace 10 such that it stays in vacuum and at high temperature. Gases such as a silicon-based source gas (MTS), an oxygen gas, a dilute gas and a carrier gas supplied from the gas feed system are fed through one end of the nanowire-synthesizing tube 20. The other end of the nanowire-synthesizing tube 20 is connected to the vacuum pump, whereby the inside of the nanowire-synthesizing tube 20 is maintained in vacuum, and gases produced inside the nanowire-synthesizing tube 20 are discharged to the outside.

A high-temperature electrical heating element 30 is disposed around the nanowire-synthesizing tube 20, and serves to heat the nanowire-synthesizing tube 20 (e.g., about 1,000° C. or above). The temperature inside the tube is measured using a thermocouple device (not shown), and feeding of source substances is started when the tube has arrived at an intended temperature.

A porous substrate 40 is placed on a susceptor (not shown) inside the nanowire-synthesizing tube 20. According to an embodiment of the present invention, the porous substrate can be made of graphite, alumina, $Si_3N_4$, SiC, or the like. As shown in FIG. 2, a covering 50 is disposed such that it surrounds the substrate 40. According to this embodiment, the covering 50 is disposed such that it surrounds four sides of the substrate 40 in order to form nanowires on the four sides of the substrate 40. When it is intended to form nanowires on upper and lower surfaces of the substrate instead of the four sides of the substrate, the covering 50 can be disposed by a certain gap from the upper and lower surfaces of the substrate, and no covering is disposed around the other surfaces of the substrate. This covering is supported inside the nanowire-synthesizing tube 20 using a separate support (not shown).

Reference will now be made to a method of synthesizing nanowires using the apparatus according to the present invention that has the above-described configuration.

First, the nanowire-synthesizing tube is heated using the electric heating element 30 in consideration of the positions of the substrate where nanowires are to be synthesized, while the temperature of the nanowire-synthesizing tube 20 is being measured using the thermocouple device. When the inside of the nanowire-synthesizing tube 20 has arrived at an intended temperature, for example, ranging from 1,100 to 1,300° C. (decomposition temperature), the plurality of gases including the source gas are fed into the nanowire-synthesizing tube 20.

According to this embodiment, the source gas is comprised of an organic silicon compound, preferably, methyltrichlorosilane (MTS). This source compound is liquid or solid at room temperature, and according to an embodiment of the present invention, is converted into the gaseous state by being evaporated by heat, such that the source gas is fed into the nanowire-synthesizing tube.

As shown in the figures, the inventors observed the shape of wires formed on the substrate while changing the gap between the porous substrate 40 and the covering 50, and consequently, discovered that the structure of growing nanowires changed depending on the gap.

Figure 3:
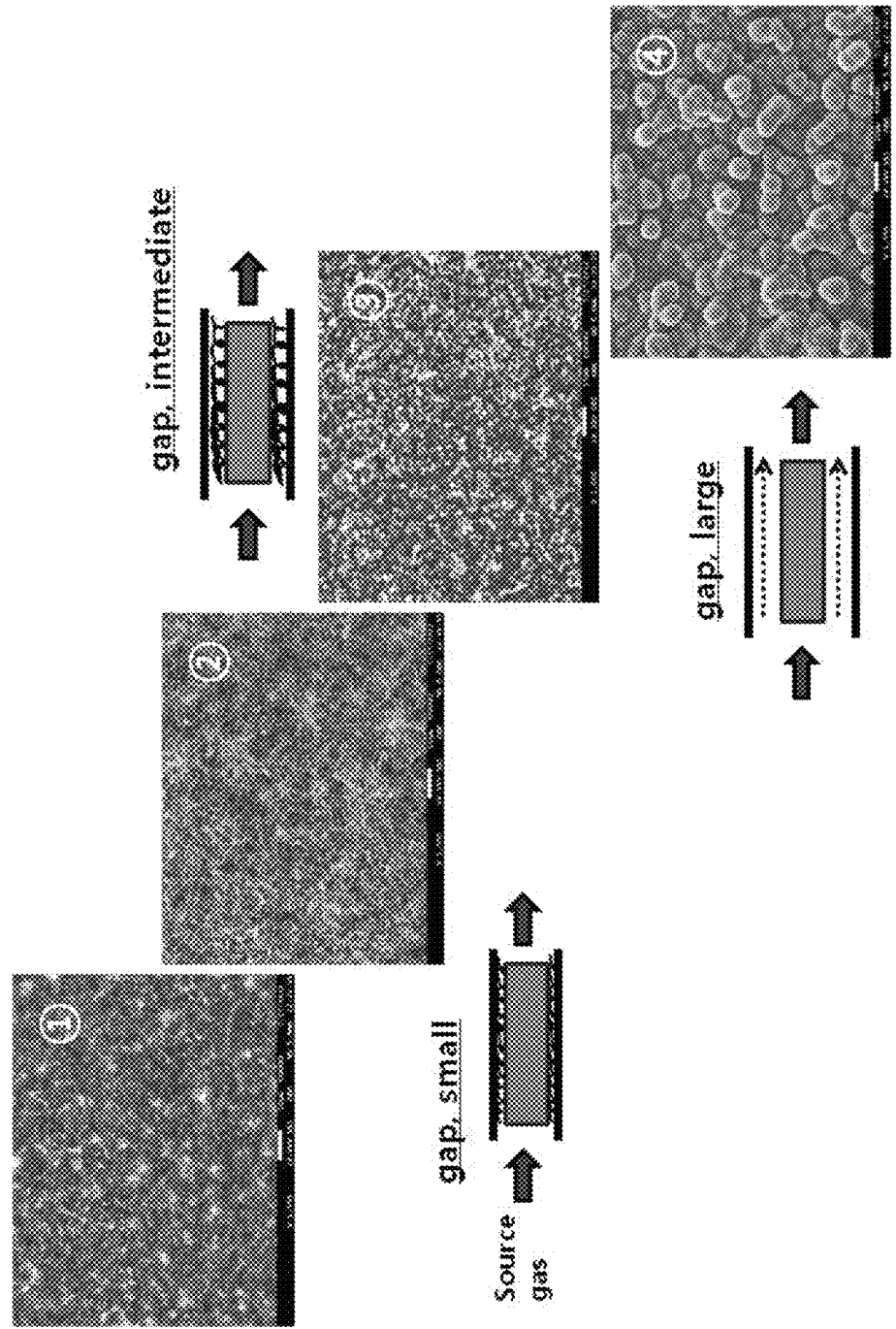
FIG. 3 is a view showing changes in a structural shape of nanowires which are synthesized by changing a gap between a substrate and a covering.

That is, FIG. 3 shows microscopic pictures of the shape of nanowires that are synthesized by gradually increasing the gap between the porous substrate 40 and the covering 50. As shown in FIG. 3, when the gap between the porous substrate 40 and the covering 50 was narrow (about 1 mm or less), the shape of nanowires was clear. When the gap was about 1 to 3 mm, a very short nanowire shape was formed. When the gap was 5 mm or greater, the nanowires were formed substantially in the shape of a film. When the gap was narrow, the source gas or the like did not promptly pass through the gap, but the source gas seems to have been retarded in the space of the gap and create a vortex flow while passing through the gap. In contrast, when the gap was wide, the effect of the covering 50 was not achieved, and nanowires were formed substantially in the same shape as in the case where wires were formed on the substrate 40 without the covering 50.

Figure 4:
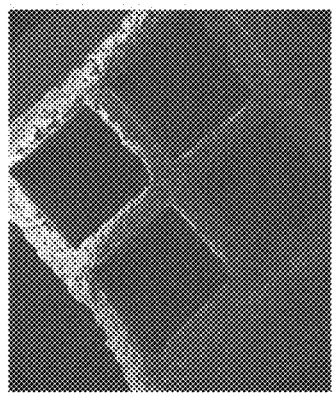
FIG. 4 is a view showing nanowires synthesized on a substrate without a covering in a related-art method, in which wires are formed substantially in the shape of a film.
Figure 4:
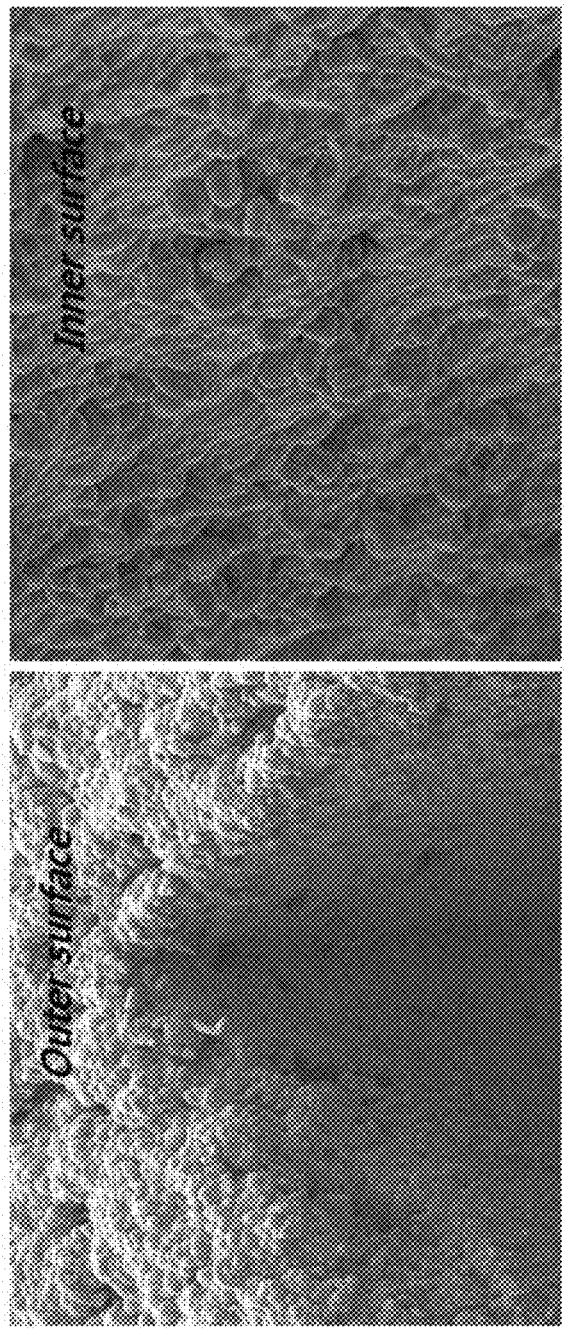

The inventors formed nanowires by blowing gas to a substrate (cordierite honeycomb structure) under the same conditions in order to compare the effect of the covering 50, and the results are presented in FIG. 4. As shown in FIG. 4, when the gas was blown without the covering, the surface was covered with nanowires substantially in the shape of a film, and the advantage of nanowires is not achieved.

Figure 5:
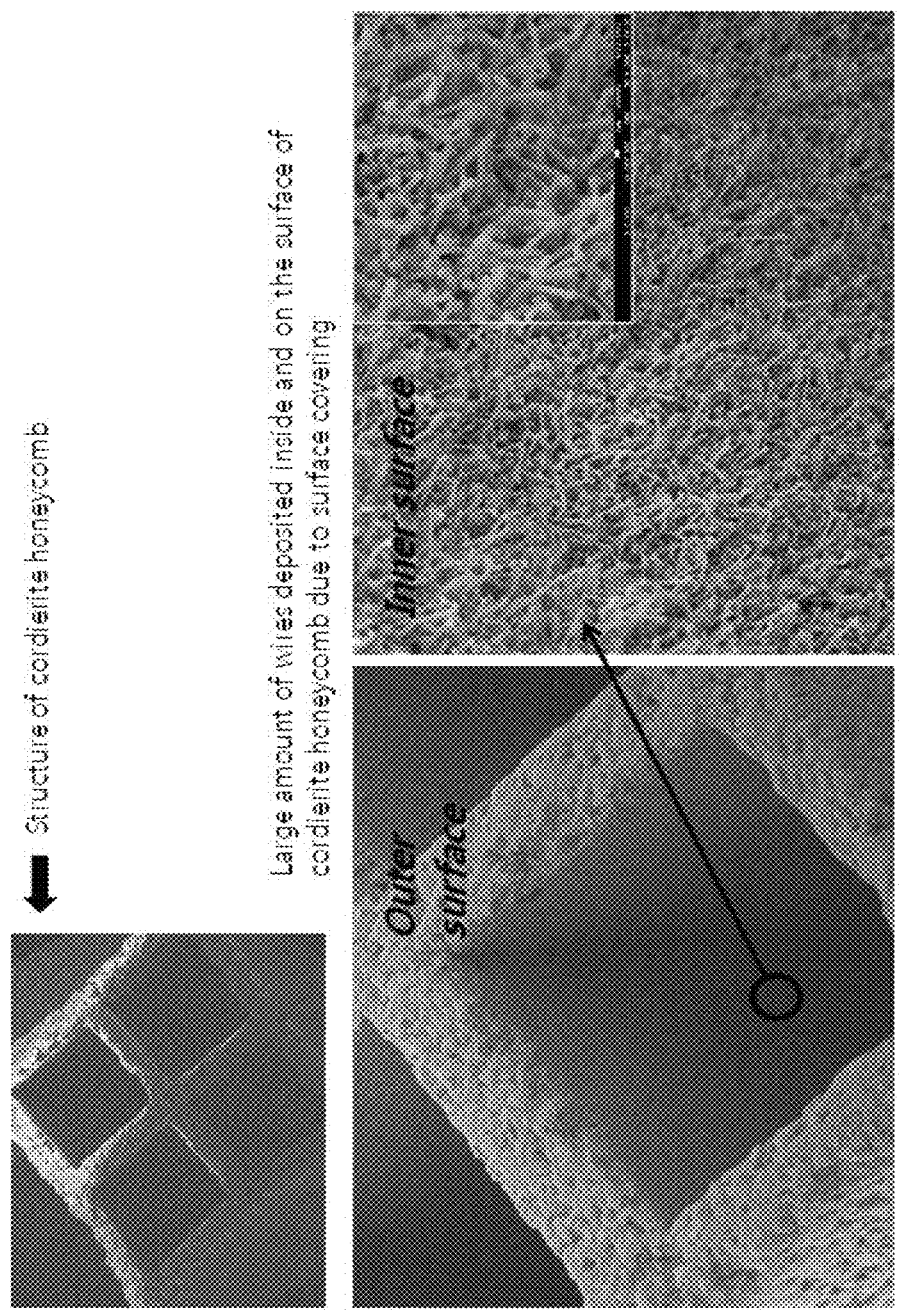
FIG. 5 is a view showing nanowires synthesized on a substrate using a covering which is disposed by a certain gap from the surface of the substrate according to the present invention, in which nanowires having a clear shape are formed not only on the surface of the substrate but also in the pores inside the substrate.

In contrast, nanowires were formed by disposing the covering 50 around the substrate 40 and blowing gas to the substrate, the results of which are presented in FIG. 5. As shown in FIG. 5, compared to the related art shown in FIG. 4, it can be appreciated that a large amount of nanowires were formed at high density inside and on the surface of a cordierite honeycomb according to the present invention.

According to an embodiment of the present invention, the source gas that is supplied after being evaporated has a flow rate of 10 sccm, and the oxygen gas is supplied at a flow rate ranging from 1 to 15 sccm, preferably, from 1 to 10 sccm. When oxygen is supplied at a flow rate exceeding 15 sccm, a film is deposited instead of nanowires.

As described above, in addition to the source gas and the oxygen gas, a dilute gas and a carrier gas are also fed into the nanowire-synthesizing tube 20. The ratio of the volume of the source gas to the volume of the dilute gas/carrier gas is set to the range from 20 to 50. When this ratio decreases below 20, a film is deposited. When this ratio exceeds 50, the synthesis density of nanowires decreases. Therefore, the volume ratio of the source gas to the other gases is adjusted in the above-defined range.

As set forth above, unlike the related art, the present invention can form high-density nanowires not only on the surface of the porous substrate but also in the pores inside the porous substrate by employing the simple structure in which the covering is disposed around the substrate at a certain distance. The substrate having nanowires as described above can be widely used for applications that strengthen the porous structure of industrial high-temperature filters, diesel exhaust filter devices and insulating porous materials.

Although the present invention has been described hereinabove with respect to the exemplary embodiments, it should be understood that the present invention is not limited to the foregoing embodiments. For example, although silicon-based nanowires were formed on the porous substrate and the reactant source was selected so as to match silicon-based nanowires, the present invention can also form various types of nanowires using the other reactant sources depending on the use. Although the covering is disposed in advance around the substrate by a certain gap, in some embodiments, it is possible to provide a displacing means for displacing the covering and control the displacement of the displacing means using a control unit, whereby the gap between the substrate and the covering can be more easily adjusted. It should be understood that all such alterations and modifications fall within the scope of the present invention. Therefore, the present invention shall be defined by only the claims and their equivalents.

The invention claimed is:

1. A method of synthesizing nanowires comprising following steps of:
   placing a substrate on which nanowires are to be synthesized inside a reaction furnace;
   disposing a covering inside a reaction furnace such that the covering is spaced apart by a predetermined gap from surfaces of the substrate and is arranged in parallel with the substrate;
   heating the reaction furnace; and
   synthesizing nanowires on the substrate by allowing a flow of a source gas of organic silicon compound into the reaction furnace, the source gas of organic silicon compound being deposited on the substrate while flowing through the predetermined gap between the substrate and the covering,
   wherein the covering retards the flow of the source gas of organic silicon compound while flowing through the predetermined gap between the substrate and the covering, the method of synthesizing nanowires is devoid of any catalysts, and the nanowires synthesized on the surfaces of the substrate have a clearer shape as a size of the predetermined gap between the substrate and the covering decreases.

2. The method according to claim 1, wherein the substrate is a porous substrate.

3. The method according to claim 2, wherein the nanowires are formed not only on a surface of the porous substrate but also in pores inside the porous substrate.

4. The method according to claim 1, wherein the gap between the substrate and the covering is preset depending on design criteria.

5. The method according to claim 1, wherein the covering is connected to a displacing means for displacing the covering and the gap between the substrate and the covering is changed by controlling a displacement of the displacing means using a control unit.

* * * * *